(12) United States Patent
Kucherov et al.

(10) Patent No.: US 7,109,408 B2
(45) Date of Patent: Sep. 19, 2006

(54) SOLID STATE ENERGY CONVERTER

(75) Inventors: Yan R. Kucherov, Salt Lake City, UT (US); Peter L. Hagelstein, Framingham, MA (US)

(73) Assignee: Eneco, Inc., Salt Lake City, UT (US)

( * ) Notice: Subject to any disclaimer, the term of this patent is extended or adjusted under 35 U.S.C. 154(b) by 0 days.

(21) Appl. No.: 10/801,072

(22) Filed: Mar. 15, 2004

(65) Prior Publication Data

US 2004/0207037 A1    Oct. 21, 2004

Related U.S. Application Data

(60) Continuation-in-part of application No. 10/307,241, filed on Nov. 27, 2002, now Pat. No. 6,906,449, which is a division of application No. 09/519,640, filed on Mar. 6, 2000, now Pat. No. 6,489,704.

(60) Provisional application No. 60/123,900, filed on Mar. 11, 1999, provisional application No. 60/454,511, filed on Mar. 13, 2003.

(51) Int. Cl.
*H01L 35/04* (2006.01)
*H01L 35/32* (2006.01)

(52) U.S. Cl. ............ 136/205; 136/201; 136/211; 136/212; 136/236.1; 136/238; 136/239; 136/240; 257/467; 257/470; 257/471; 310/306

(58) Field of Classification Search ............ 136/201, 136/205, 211, 212, 236.1, 238, 239, 240; 257/467, 470, 471; 310/306
See application file for complete search history.

(56) References Cited

U.S. PATENT DOCUMENTS

| | | | |
|---|---|---|---|
| 3,173,032 A | 3/1965 | Maynard | |
| 3,267,308 A | 8/1966 | Hernqvist | |
| 3,328,611 A | 6/1967 | Davis | |
| 3,391,030 A | * 7/1968 | Beaver, Jr. et al. | .......... 136/203 |
| 3,515,908 A | 6/1970 | Caldwell | |
| 3,579,031 A | 5/1971 | Kearns | |

(Continued)

FOREIGN PATENT DOCUMENTS

EP    0 452 661 A3    10/1991

(Continued)

OTHER PUBLICATIONS

Hagelstein et al, "Thermally-Induced Current Injection across n*-n Junction," 21st International Conference on Thermoelectrics, pp. 400-403, Aug. 25-29, 2002.*

(Continued)

*Primary Examiner*—Alan Diamond
(74) *Attorney, Agent, or Firm*—Workman Nydegger

(57) ABSTRACT

A solid-state energy converter with a semiconductor or semiconductor-metal implementation is provided for conversion of thermal energy to electric energy, or electric energy to refrigeration. In n-type heat-to-electricity embodiments, a highly doped n* emitter region made of a metal or semiconductor injects carriers into an n-type gap region. A p-type layer is positioned between the emitter region and gap region, allowing for discontinuity of corresponding Fermi-levels and forming a potential barrier to sort electrons by energy. Additional p-type layers can optionally be formed on the collector side of the converter. One type of these layers with higher carrier concentration (p*) serves as a blocking layer at the cold side of the converter, and another layer (p**) with carrier concentration close to the gap reduces a thermoelectric back flow component. Ohmic contacts on both sides of the device close the electrical circuit through an external load to convert heat to electricity. In the case of a refrigerator, the external load is substituted by an external power supply.

33 Claims, 6 Drawing Sheets

U.S. PATENT DOCUMENTS

| | | | |
|---|---|---|---|
| 3,808,477 | A | 4/1974 | Swank |
| 3,843,896 | A | 10/1974 | Rason et al. |
| 3,890,161 | A | 6/1975 | Brown, III |
| 3,899,696 | A | 8/1975 | Fletcher et al. |
| 3,983,423 | A | 9/1976 | Rasor et al. |
| 4,040,903 | A | 8/1977 | Monroe, Jr. |
| 4,047,093 | A | 9/1977 | Levoy |
| 4,151,438 | A | 4/1979 | Fitzpatrick et al. |
| 4,188,571 | A | 2/1980 | Brunson |
| 4,266,179 | A | 5/1981 | Hamm, Jr. |
| 4,280,074 | A | 7/1981 | Bell |
| 4,281,280 | A | 7/1981 | Richards |
| 4,298,768 | A | 11/1981 | Israel et al. |
| 4,303,845 | A | 12/1981 | Davis |
| 4,323,808 | A | 4/1982 | Davis |
| 4,346,330 | A | 8/1982 | Lee et al. |
| 4,368,416 | A | 1/1983 | James |
| 4,373,142 | A | 2/1983 | Morris |
| 4,482,910 | A * | 11/1984 | Nishizawa et al. ............ 257/26 |
| 4,528,417 | A | 7/1985 | Chubb |
| 4,667,126 | A | 5/1987 | Fitzpatrick |
| 4,700,099 | A | 10/1987 | Iden |
| 4,750,023 | A | 6/1988 | Shannon |
| 4,755,350 | A | 7/1988 | Kennel |
| 4,771,201 | A | 9/1988 | Free |
| 4,927,599 | A | 5/1990 | Allen |
| 5,028,835 | A | 7/1991 | Fitzpatrick |
| 5,327,038 | A | 7/1994 | Culp |
| 5,459,367 | A | 10/1995 | Davis |
| 5,492,570 | A | 2/1996 | Horner-Richardson et al. |
| 5,541,464 | A | 7/1996 | Johnson et al. |
| 5,572,042 | A | 11/1996 | Thomas et al. |
| 5,578,886 | A | 11/1996 | Holmlid et al. |
| 5,623,119 | A | 4/1997 | Yater et al. |
| 5,637,946 | A | 6/1997 | Bushman |
| 5,646,474 | A | 7/1997 | Pryor |
| 5,722,242 | A | 3/1998 | Edelson |
| 5,780,954 | A | 7/1998 | Davis |
| 5,841,219 | A | 11/1998 | Sadwick et al. |
| 5,955,772 | A * | 9/1999 | Shakouri et al. ............ 257/467 |
| 5,973,259 | A | 10/1999 | Edelson |
| 5,981,071 | A | 11/1999 | Cox |
| 5,994,638 | A | 11/1999 | Edelson |
| 6,020,671 | A | 2/2000 | Pento et al. |
| 6,022,637 | A | 2/2000 | Wilson |
| 6,037,697 | A | 3/2000 | Begg et al. |
| 6,060,331 | A | 5/2000 | Shakouri et al. |
| 6,203,939 | B1 | 3/2001 | Wilson |
| 6,323,414 | B1 | 11/2001 | Shakouri et al. |
| 6,396,191 | B1 * | 5/2002 | Hagelstein et al. ......... 310/306 |
| 6,403,874 | B1 * | 6/2002 | Shakouri et al. ............ 136/201 |
| 6,489,704 | B1 * | 12/2002 | Kucherov et al. ......... 310/306 |
| 6,779,347 | B1 * | 8/2004 | Kucherov et al. ............ 62/3.1 |
| 6,906,449 | B1 * | 6/2005 | Kucherov et al. ......... 310/306 |
| 2002/0033188 | A1 * | 3/2002 | Shakouri et al. ............ 136/201 |
| 2003/0033818 | A1 * | 2/2003 | Kucherov et al. ............ 62/3.1 |
| 2004/0050415 | A1 * | 3/2004 | Kucherov et al. .......... 136/252 |

FOREIGN PATENT DOCUMENTS

JP            2001-217469 A    *    8/2001

OTHER PUBLICATIONS

Hagelstein et al, "Thermally-Induced Current Injection across an npn Junction," 22nd International Conference on Thermoelectrics, pp. 554-557, Aug. 17-21, 2003.*

Hagelstein et al, "Study of Emitter Structures for InSb Thermal Diodes," 22nd International Conference on Thermoelectrics, pp. 578-581, Aug. 17-21, 2003.*

Kucherov et al, "Importance of Barrier Layers in Thermal Diodes for Energy Conversion," Journal of Applied Physics, vol. 97, (2005), pp. 1-8.*

D.M. Rowe, Ph.D., D.Sc., *CRC Handbook of THERMOELECTRICS*, CRC Press, 1995.

Bass, John C. et al., *Improved Termoelectric Converter Units and Power Generators*, Electronics Tech Briefs, Dec. 1999.

DiSalvo, Francis, J., *Thermoelectric Cooling and Power Generation*, Science, vol. 285 (Jul. 30, 1999), pp. 703-706.

Mahan, G.D. et al., *Multilayer Thermionic Refrigerator and Generator*, Journal of Applied Physics, vol. 83, No. 9, May 1, 1998, pp. 4683-4689.

Mahan, G.D., et al., *Multilayer Thermionic Refrigeration*, Physical Review Letters, vol. 80, No. 18, May 4, 1998, pp. 4016-4019.

Rasor, Ned S., *VA. Technology of Thermoelectric and Thermionic Energy Conversion*, RASOR Associates Report, 1989, pp. 397-413.

Rasor, Ned S., *VB. Engineering Aspects of Thermionic Energy Conversion*, RASOR Associates Report, 1989, pp. 415-439.

Lin, T.P. et al., *Thermionic Emission Including Both Space-charge and Image Forces*, Journal of Applied Physics, vol. 85, No. 8, Apr. 15, 1989, pp. 3205-3211.

Capper, Peter, *Properties of Narrow Gap Cadmium-based Compounds*, EMIS Datareviews Series No. 10, Dec. 1993, pp. 207-211.

Bates, Clayton W. Jr., *Low-temperature Thermionic Emitters Using Metal-semiconductor Composites*, Materials Letters, vol. 23, Apr. 1995, pp. 1-5.

Shakouri, Ali et al., *Heterostructure Integrated Thermionic Coolers*, Applied Physics Letters, vol. 71, No. 9, Sep. 1, 1997, pp. 1234-1236.

Collier, C.P. et al., *Electronically Configurable Molecular-Based Logic Gates*, Science, vol. 285, Jul. 16, 1999, pp. 391-394.

Hagelstein, P.L et al., *Enhanced Figure of Merit in Thermal to Electrical Energy Conversion Using Diode Structures*, Applied Physics Letters, vol. 81, No. 3, Jul. 15, 2002, pp. 559-561.

Kuchervo, Y. et al. *Energy Conversion Using Diode-like Structures*, Proceedings of the 21st International Conference on Thermoelectronics, 2002.

Hagelstein, P.L. at al. *Thermally-Induced Current Injection Across an n\*-n Junction*, Proceedings of the 21st International Conference on Thermoelectronics, 2002.

Hagelstein, P.L. et al. *Thermally-Induced Current Injection across an npn Structure*, Proceedings of the 22nd International Conference on Thermoelectrics, 2003.

Kucherov, Y. et al. *Study of Emitter Structures for InSb Termal Diodes*, Proceedings of the 22nd International Conference on Thermoelectrics, 2003.

Venkatasubramanian, R. et al. *Thin-Film Thermoelectric Devices with High Room-Temperature Figures of Merit*, Nature, vol. 413, Oct. 11, 2001.

\* cited by examiner

InSb, {Te, E18}, t=0.5 mm, $T_{hot}$ = 300°C, $T_{cold}$ = 10°C

InSb, {Te, E18}, t=0.5 mm, $T_{hot}$ = 300°C, $T_{cold}$ = 10°C

SOLID STATE ENERGY CONVERTER

This application claims the benefit of priority to U.S. Provisional Application No. 60/454,511, filed on Mar. 13, 2003, and is a continuation-in-part of U.S. application Ser. No. 10/307,241, filed on Nov. 27, 2002, now U.S. Pat. No. 6,906,449 which is a divisional of U.S. application Ser. No. 09/519,640, filed on Mar. 6, 2000, now U.S. Pat. No. 6,489,704 B1, which claims the benefit of priority to U.S. Provisional Application No. 60/123,900, filed on Mar. 11, 1999, the disclosures of which are incorporated herein by reference.

BACKGROUND OF THE INVENTION

1. Field of the Invention

The present invention relates to the conversion of thermal energy to electrical energy, and electrical energy to refrigeration, and more particularly to a solid state thermionic converter using semiconductor diode implementation.

2. Relevant Technology

Thermionic energy conversion is a method of converting heat energy directly into electrical energy by thermionic emission. In this process, electrons are thermionically emitted from the surface of a metal by heating the metal and imparting sufficient energy to a portion of the electrons to overcome retarding forces at the surface of the metal in order to escape. Unlike most other conventional methods of generating electrical energy, thermionic conversion does not require either an intermediate form of energy or a working fluid, other than electrical charges, in order to change heat into electricity.

In its most elementary form, a conventional thermionic energy converter includes one electrode connected to a heat source, a second electrode connected to a heat sink and separated from the first electrode by an intervening space, leads connecting the electrodes to an electrical load, and an enclosure. The space in the enclosure is either highly evacuated or filled with a suitable rarefied vapor, such as cesium.

The essential process in a conventional thermionic converter is as follows. The heat source supplies heat at a sufficiently high temperature to one electrode, the emitter, from which electrons are thermionically evaporated into the evacuated or rarefied vapor-filled interelectrode space. The electrons move through this space toward the other electrode, the collector, which is kept at a low temperature near that of the heat sink. There the electrons condense and return to the hot electrode via external electrical leads and an electrical load connected between the emitter and the collector. The flow of electrons through the electrical load is sustained by the temperature difference between the electrodes. Thus, electrical work is delivered to the load.

Thermionic energy conversion is based on the concept that a low electron work function cathode in contact with a heat source will emit electrons. These electrons are absorbed by a cold, high work function anode, and they can flow back to the cathode through an external load where they perform useful work. Practical thermionic generators are, limited by the work function of available metals or other materials that are used for the cathodes. Another important limitation is the space charge effect. The presence of charged electrons in the space between the cathode and anode will create an extra potential barrier which reduces the thermionic current. These limitations detrimentally affect the maximum current density, and thus present a major problem in developing large-scale thermionic converters.

Conventional thermionic converters are typically classified as vacuum converters or gas-filled converters. Vacuum converters have an evacuated medium between the electrodes. These converters have limited practical applications.

Embodiments in a first class of gas-filled converters are provided with a vaporized substance in the interelectrode space that generates positive ions. This vaporized substance is commonly a vaporized alkali metal such as cesium, potassium and rubidium. Because of the presence of these positive ions, liberated electrons can more easily travel from the emitter to the collector. The emitter temperature in this type of conventional device is in part determined by the vaporization temperature of the substance that generates the positive ions. Generally, the emitter temperature should be at least 3.5 times the temperature of the reservoir of the positive ion generating substance if efficient production of ions is to be achieved in these conventional devices.

Embodiments in a second class of gas-filled converters are provided with a third electrode to generate ions, and the gas in the interelectrode space in these conventional devices is an inert gas such as neon, argon, or xenon. Although these converters can operate at lower temperatures, such as about 1500 K, they are more complex.

Typical conventional thermionic emitters are operated at temperatures ranging from about 1400 K to about 2200 K, and thermionic collectors are operated at temperatures ranging from about 500 K to about 1200 K. Under optimum conditions of operation, overall efficiencies of energy conversion range from 5% to 40%, electrical power densities are of the order of 1 to 100 watts/cm$^2$, and current densities are of the order of 5 to 100 A/cm$^2$. In general, the higher the emitter temperature, the higher the efficiency, the power and current densities with designs accounting for radiation losses. The voltage at which the power is delivered from one unit of a typical converter is 0.3 to 1.2 volts, i.e., about the same as that of an ordinary electrolytic cell. Thermionic systems with a high power rating frequently include many thermionic converter units connected electrically in series. Each thermionic converter unit is typically rated at 10 to 500 watts.

The high-temperature attributes of thermionic converters are advantageous for certain applications, but they are restrictive for others because the required emitter temperatures are generally beyond the practical capability of many conventional heat sources. In contrast, typical thermoelectric converters are operable at heat source temperatures ranging from about 500 K to about 1500 K. However, even under optimum conditions, overall efficiencies of thermoelectric energy converters only range from 3% to 10%, electrical power densities are normally less than a few watts/cm$^2$, and current densities are of the order of 1 to 100 A/cm$^2$.

From a physics standpoint, thermoelectric devices are similar to thermionic devices. In both cases a temperature gradient is placed upon a metal or semiconductor, and both cases are based upon the concept that electron motion is electricity. However, the electron motion also carries energy. A forced current transports energy for both thermionic and thermoelectric devices. The main difference between thermoelectric and thermionic devices is in the transport mechanism; ballistic and diffusive transport for thermionics and ohmic transport for thermoelectrics. Ohmic flow is macroscopically diffusive, but not microscopically diffusive. The distinguishing feature is whether excess carriers are present. In thermoelectrics, the carriers normally present are responsible for current. In thermionics, the current is due to putting excess carriers in the gap. A thermionic device has a relatively high efficiency if the electrons ballistically go over and across the gap. For a thermionic device all of the kinetic energy is carried from one electrode to the other. The motion of electrons in a thermoelectric device is quasi-equilibrium and ohmic, and can be described in terms of a Seebeck coefficient, which is an equilibrium parameter.

In structures with narrow barriers, the electrons will not travel far enough to suffer collisions as they cross the barrier. Under these circumstances, the ballistic version of thermionic emission theory is a more accurate representation of the current transport.

Solutions to the foregoing problems have been sought according to the present state of the art by using vacuum converters or gas-filled converters. Attempts to reduce space-charge effects with vacuum converters have involved the reduction of the interelectrode separation to the order of micrometers. Attempts to reduce the same effects with gas-filled converters have led to the introduction of positive ions into the cloud of electrons in front of the emitter. Nevertheless, these conventional devices still present shortcomings such as those related to limited maximum current densities and temperature regimes.

Consequently, there remains a need to provide a more satisfactory solution to converting thermal energy to electrical energy at lower temperature regimes with high efficiencies and high power densities.

SUMMARY OF THE INVENTION

The present invention relates to solid state energy converter devices and methods with a semiconductor or semiconductor-metal implementation for conversion of thermal energy to electric energy, or electric energy to refrigeration. In n-type heat-to-electricity embodiments of the invention, a highly doped n* emitter region made of a metal or semiconductor material injects carriers into an n-type gap region. A p-type layer is positioned between the emitter region and the gap region, allowing for discontinuity of corresponding Fermi-levels and forming a potential barrier to sort electrons by energy.

Additional p-type layers can optionally be formed on the collector side of the gap region. One type of these layers with higher carrier concentration (p*) serves as a blocking layer at the cold side of the device, and another layer (p**) with carrier concentration close to the n-type concentration in the gap reduces a thermoelectric back flow component. These p-type layers can be used alone or together on the collector side. Ohmic contacts on both sides of the device close the electrical circuit through an external load. In the case of a refrigerator, the external load is substituted by an external power supply.

In additional embodiments of the invention, p-type converters can be formed, as well as thermal diode stacks. The invention works for holes as well as for electrons. Efficiencies approaching thermodynamic limit can be achieved with the devices of the invention.

These and other features of the present invention will become more fully apparent from the following description and appended claims, or may be learned by the practice of the invention as set forth hereinafter.

BRIEF DESCRIPTION OF THE DRAWINGS

In order to illustrate the manner in which the above recited and other features of the invention are obtained, a more particular description of the invention briefly described above will be rendered by reference to specific embodiments thereof, which are illustrated in the appended drawings. Understanding that these drawings depict only typical embodiments of the invention and are not therefore to be considered limiting in scope, the invention will be described and explained with additional specificity and detail through the use of the accompanying drawings in which.

DETAILED DESCRIPTION OF THE INVENTION

The present invention relates to solid state energy converter devices with a semiconductor or semiconductor-metal implementation for conversion of thermal energy to electric energy, or electric energy to refrigeration. The invention can be implemented for holes as well as for electrons. Efficiencies approaching thermodynamic limits can be achieved with the devices of the invention.

Figure 1:
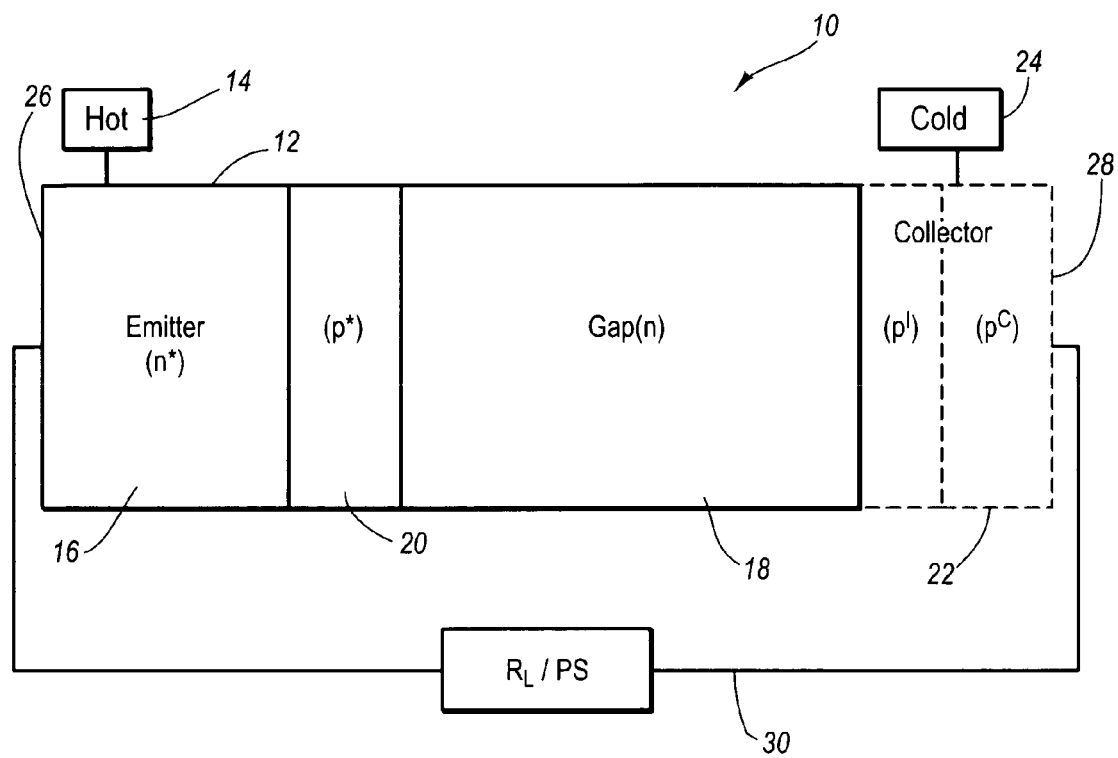
FIG. 1 is a schematic depiction of a thermal diode embodiment of the present invention that improves thermoelectric performance of a given semiconductor device.

Referring to the drawings, FIG. 1 is a schematic depiction of one embodiment of a solid state energy converter of the invention in the form of a thermal diode 10, which improves thermoelectric performance of a given semiconductor device. As shown in FIG. 1, thermal diode 10 has n-type conductivity, and includes an emitter region 12 in thermal communication with a hot heat exchange surface 14. The emitter region 12 comprises an n-type region 16 with donor concentration n* for electron emission. A semiconductor gap region 18, with a donor doping n, is in electrical and thermal communication with emitter region 12. A p-type barrier layer 20 with acceptor concentration p* is interposed between emitter region 12 and gap region 18. The barrier layer 20 is configured to provide a potential barrier and Fermi-level discontinuity between emitter region 12 and gap region 18.

As further shown in FIG. 1, thermal diode 10 can optionally include a collector region 22 in thermal communication with a cold heat exchange surface 24. The gap region 18 is in electrical and thermal communication with collector region 22 when present. A first ohmic contact 26 is in electrical communication with emitter region 12 and a second ohmic contact 28 is in electrical communication with collector region 22. The first and second ohmic contacts 26, 28 close an electrical circuit 30 through an external load ($R_L$) for heat to electricity conversion. Alternatively, the first and second ohmic contacts 26, 28 can close electrical circuit 30 through an external power source (PS), in place of the external load, for electricity to refrigeration conversion.

The collector region 22 can include an additional injection barrier layer ($p^I$) with a carrier concentration $p^{**}$ that is adjacent to gap region 18 to reduce a thermoelectric back flow component. The collector region 22 can also include an additional compensation layer ($p^C$), with acceptor concentration $p^*$ being the same as donor concentration in gap region 18, and serving as a blocking layer at the cold side of the converter.

The collector region 22 can also include both p-type layers, the additional injection layer ($p^I$) and the additional compensation layer ($p^C$), with the injection layer placed between the gap region and the compensation layer.

It should be understood that emitter region 12 and gap region 18 greatly improve thermoelectric performance of thermal diode 10, and the device is viable even without collector region 22.

The emitter region 12 is formed of electrically and thermally conductive materials such as metals, metal alloys, semiconductors, or doped semiconductors. The emitter may also include an electrically and thermally conductive material on a substrate. Non-limiting examples of suitable materials for the emitter region include $Hg_{1-x}Cd_xTe$, $Cd_3As_2$, $CdSnAs_2$, SiGe alloys, TAGS, $InAs_{1-x}Sb_x$, $Ga_xIn_{1-x}As_ySb_{1-y}$, PbTe, PbSe, PbS, $Ge_{1-x}Sn_x$ and the like. The emitter region 12 can have a thickness of greater than about 1 µm, or about 2 carrier scattering lengths.

The gap region 18 can be formed with semiconductor materials such as InSb, HgCdTe, $Cd_3As_2$, $CdSnAs_2$, $Ge_{1-x}Sn_x$, $CdGeAs_2$, InGaSbAs, PbTe, PbS, PbSe, and the like. The semiconductor materials used in the gap region can be in the form of wafers doped with an n-type impurity such as tellurium. The gap region 18 can be segmented so that it includes a first layer of a semiconductor material, and a second layer that reduces heat flow density made of a metal or a different highly n-doped semiconductor material.

The semiconductor gap (first layer) in gap region 18 can be as thin as one or more carrier scattering lengths to preserve potential barrier structure. For example, the semiconductor gap can be at least 1 carrier scattering length wide, and preferably at least 5 carrier scattering lengths wide. The gap region can have a total thickness of up to about 1 mm. Metal materials that may be used in the gap region include Mo, steel, and the like.

The p-type barrier layer 20 can have a thickness of up to about 1 µm, and can be formed by deposition of a semiconductor such as InSb doped with a p-type impurity (e.g., Co, Zn, Ge, Mn, Mg, Fe, Cu, Ag, Cr, etc.). As discussed in more detail hereafter, the p* doping concentration of the p-type layer relates to the n doping concentration of the gap region as $p_i > n_i (m^*_p/m^*_n)$, where $m^*_p$ is the effective mass of holes, $m^*_n$ is the effective mass of electrons, and subscript i denotes ionized fraction of carriers at a given temperature.

In an alternative embodiment of a solid state energy converter of the invention, thermal diode 10 of FIG. 1 can be formed with p-type conductivity. Such an embodiment includes an emitter region 12 in thermal communication with a hot heat exchange surface, with the emitter region comprising a p-type region with acceptor concentration p* for hole emission. A semiconductor gap region 18, with a acceptor doping p, is in electrical and thermal communication with emitter region 12. An n-type barrier layer 20 with donor concentration n* is interposed between emitter region 12 and gap region 18. The p-type thermal diode can optionally include a collector region 22 in thermal communication with a cold heat exchange surface. A first ohmic contact is in electrical communication with emitter region 12 and a second ohmic contact is in electrical communication with collector region 22.

The converter devices of the invention can be formed by conventional deposition techniques that are typically used to form metallic and semiconductor layers, which are well known to those skilled in the art.

EXAMPLES

The following examples are provided to illustrate the present invention, and are not intended to limit the scope of the invention.

Example 1

Emitter and Converter Design

In developing the present invention, indium antimonide (InSb) was used as a model semiconductor material, due to its commercial availability. InSb has one of the highest known electron mobilities and the largest scattering length (0.8 microns at room temperature). On the other hand, the thermal conductivity of InSb is relatively high, resulting in a below average thermoelectric figure of merit (ZT=0.2 for optimized conditions). It should be understood that most of the results achieved experimentally for InSb can be applied for a variety of other semiconductors with corrections for their properties. However, two extreme cases where this approach might not work is when the bandgap is too small (less than $k_BT$, where $k_B$ is Boltzmann's constant and T is absolute temperature), or too large, such that it is difficult to create a thermal current induced Fermi-level discontinuity within reasonable barrier height, such as less than 10 $k_BT$.

Wafers (gap) doped with tellurium (n-type) were used in the present design. Doping level was around $10^{18}$ atoms per cubic centimeter (atoms/cm$^3$). The basic design for an n-type converter is n*/p/n, where n* is the emitter (can be either metal or semiconductor), p is the barrier layer, and n is the gap material. A corresponding p-type converter layout is p*/n/p, where p* is the emitter, n is the barrier layer, and p is the gap material. For simplicity, p-type converter embodiments will not be discussed further, with the understanding that the physics involved is the same and design changes are evident. On the collector side of the converter, addition of a p-type compensation layer further improves device performance. An additional current injection effect, which is described hereafter, can provide even higher device performance.

Figure 2:
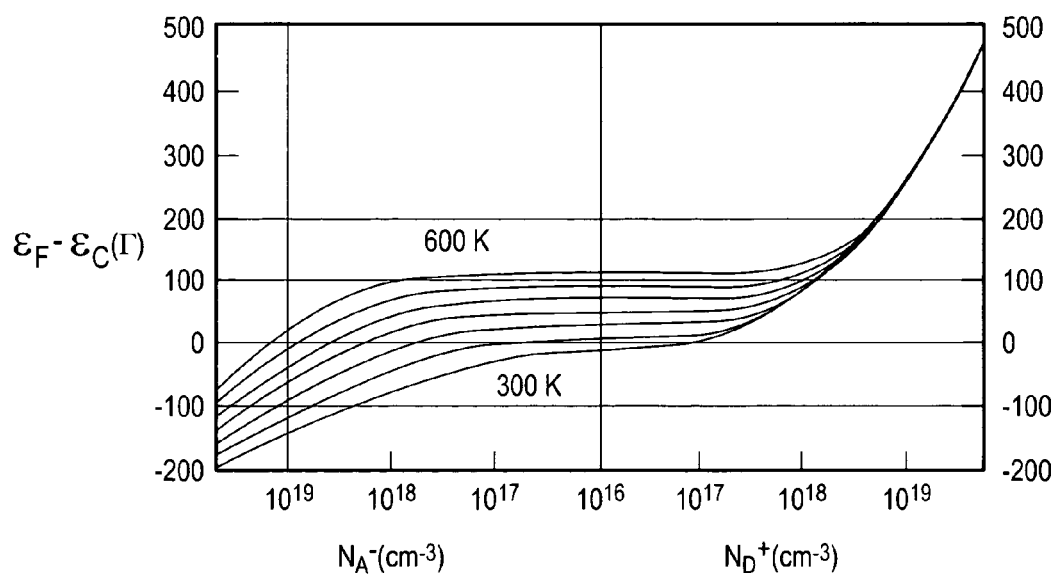
FIG. 2 is a plot of the Fermi level for InSb, relative to the bottom of the conduction band, as a function of ionized acceptor concentration (left) and ionized donor concentration (right)

In forming a converter according to the present invention, an emitter layer with an n* region was formed by depositing an InSb layer that was highly doped with tellurium, or by depositing a metal layer in the form of In, Mo, or In—Ga eutectic. The p-type layer was formed to create a potential barrier for hot electron injection, and provides a discontinuity of the Fermi level, thus preventing electrical short-out of the emitter. Addition of any p-type layer on an n-type gap creates a potential barrier, but only high enough concentration of p-type carriers ensures a discontinuity of the Fermi level. In other words, the p-type layer functions as a separator. Positioning of the Fermi level relative to the bottom of the conduction band as a function of donor and acceptor concentration is described by Kane's diagram. FIG. 2 is a Kane's diagram for InSb, which shows a plot of the Fermi level (meV) as a function of ionized acceptor concentration (left) and ionized donor concentration (right). FIG. 2 illustrates the results for temperatures of 300 K, 350 K, 400 K, 450 K, 500 K, 550 K, and 600 K.

Figure 3A:
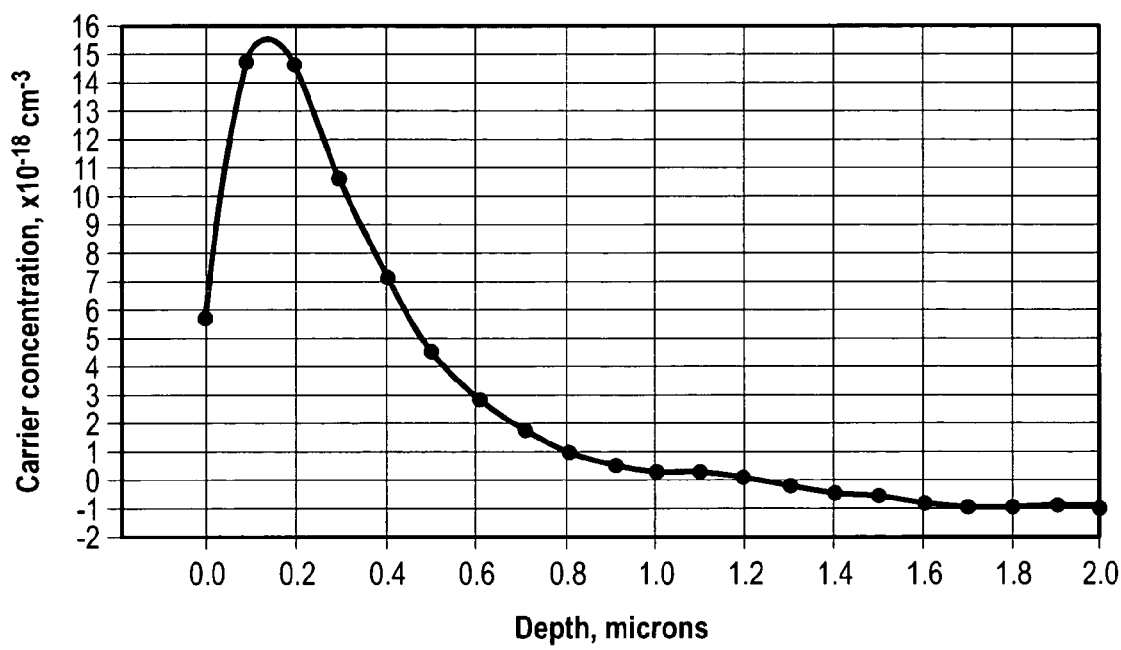
FIGS. 3A and 3B are plots of a calculated carrier concentration impurity profile and corresponding barrier shape for He-4 implantation.
Figure 3B:
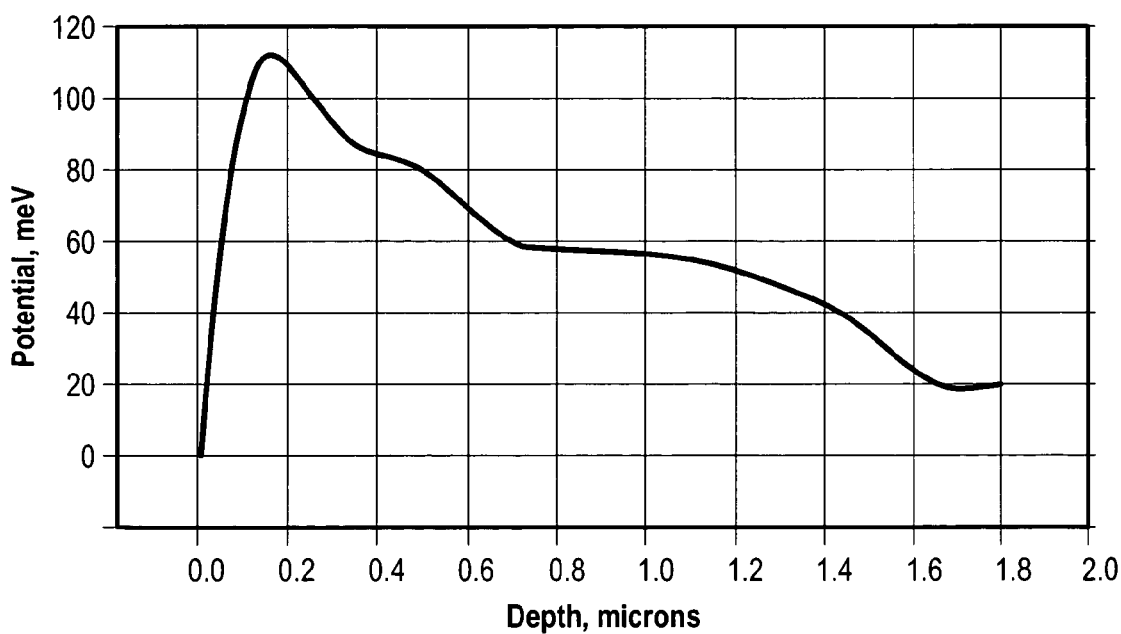

The p-type layer was formed using a method based on the fact that a vacancy in InSb forms a p-type impurity with the same ionization energy as Te (50 meV). This is convenient in the sense that relative concentration of both n- and p-type impurities stays the same over the whole temperature change range. Vacancy concentration induced by inert gas implantation was modeled by TRIM-91 software (Ziegler and Biersack, IBM, 1991). FIG. 3A is a plot of a calculated carrier concentration impurity profile after 20–350 keV $^4$He implantation in InSb doped with Te to $1 \times 10^{18}$ cm$^{-3}$, and FIG. 3B is a corresponding calculated barrier shape for implantation at room temperature.

Figure 4:
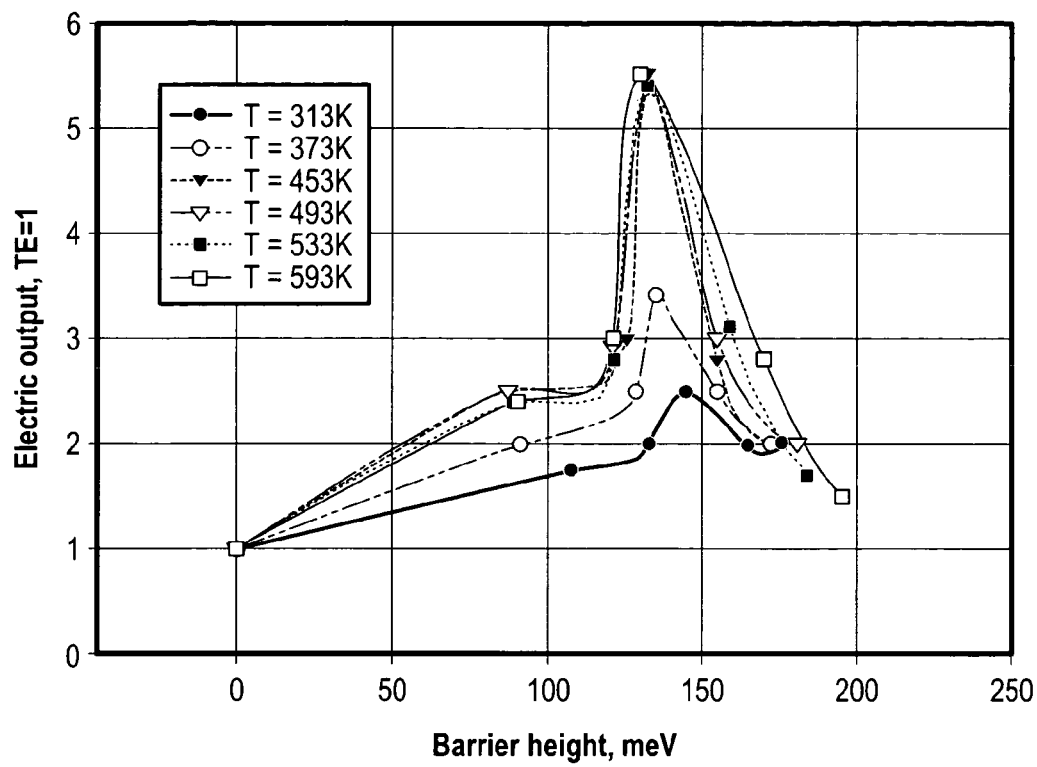
FIG. 4 is a plot of relative electric output as a function of emitter barrier height.

This particular impurity profile and others were realized using commercial implanters (Core Systems, Inc., Sunnyvale, Calif.). Implanted InSb wafers were cut into small pieces, typically a few square millimeters, and tested in test apparatus, described elsewhere (see e.g., P. Hagelstein and Y. Kucherov, Proceedings of the 2001 Fall Materials Research Society Conference, Boston, Mass., edited by G. S. Nolas, Vol. 691, pp.319–324, which is incorporated herein by reference). Pieces of the same wafers without ion implanted layers provided a thermoelectric reference. Cumulative test results are shown in FIG. 4 for 0.5 mm thick wafers in a plot of relative electric output as multiple of thermoelectric performance for different emitter barrier heights and temperatures.

The barrier width was the same as shown in FIG. 2. The peak of performance was approximately one $k_B T$ wide ($k_B$ is Boltzmann's constant and T is the absolute temperature). At 313 K there is no change relative to the thermoelectric performance, until the barrier height reaches approximately 4 $k_B T$. Optimum barrier height goes down as the temperature goes up. There was up to 6 times the thermoelectric output observed.

The effective mass of electrons is $m^*_n = m_n/m_o = 0.0136$ ($m_o$ is free electron mass), and the effective mass for holes is $m^*_p = m_p/m_o$ is 0.2 (see G. Slack, CRC Handbook of Thermoelectrics, p. 420, CRC press, 1995). The ratio is 14.7 and experimental peak performance occurs when hole concentration is about 14.5–15.5 times higher than electron concentration. In other words, Fermi level discontinuity and for this particular case maximum output happens when there is a delocalized compensation layer. It should be noted that at low doping levels in the gap, maximum performance can be at barrier doping levels higher than the compensation level to provide a higher barrier. But in most cases compensation condition is sufficient. In U.S. Pat. No. 6,396,191 B1, the disclosure of which is incorporated herein by reference, maximum collector performance at a localized compensation point is described, when concentration of p and n-type impurities is the same.

In the general case, localized compensation can be written for a given semiconductor as:

$$p_i = n_i \quad (1),$$

where $p_i$ is the ionized acceptor impurity concentration and $n_i$ is the ionized donor impurity concentration. Ionized fraction of impurity is defined (for acceptors as an example) as $p_i = p/(1 + g \exp\{E_F - E_i / k_B T\})$, where $E_i$ is the ionization energy for a given impurity, $E_F$ is the Fermi level, g is the degeneracy factor, which is 4 in the case of InSb, $k_B$ is the Boltzmann constant, and T is the absolute temperature. For a delocalized compensation, corresponding to a maximum emitter performance:

$$p_i > n_i (m^*_p / m^*_n) \quad (2).$$

Figure 5:
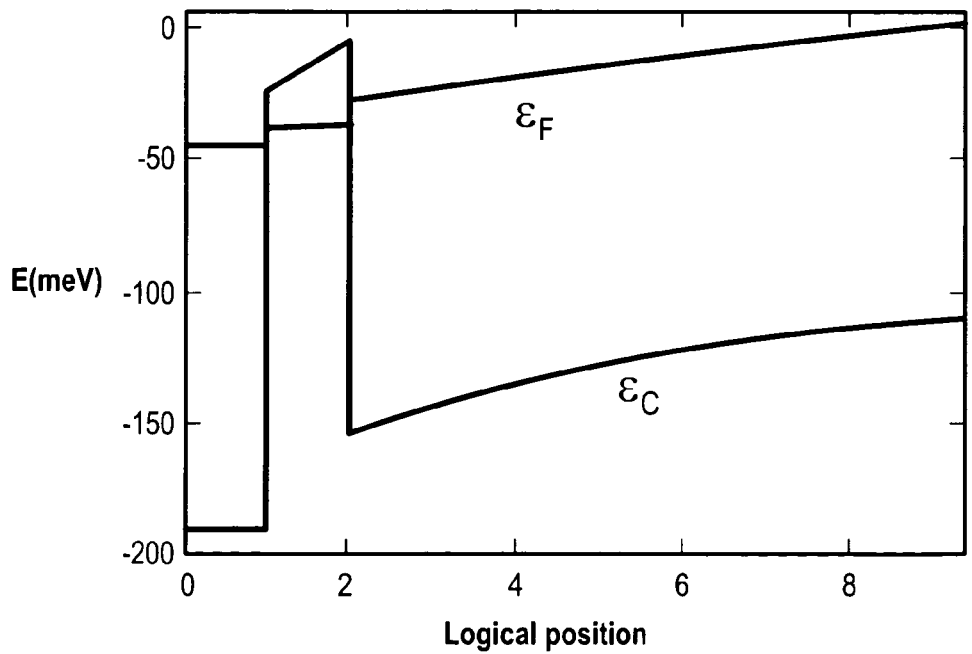
FIG. 5 is a plot of the ideal calculated positions of the Fermi-level and the bottom of the conductance band for a InSb gap region with $10^{18}$ cm$^{-3}$ Te doping and a p-type barrier.

Equation (2) allows one to optimize the emitter side for InSb and probably any other semiconductor. A six times increase in thermoelectric performance elevates an InSb device to a status of a relatively good thermoelectric. Ideal calculated positions of the Fermi-level and the bottom of conductance band for an InSb gap with $10^{18}$ cm$^3$ Te doping and a p-type barrier are shown in the plot of FIG. 5.

A layer of intrinsic material with a thickness larger than the scattering length functionally appears to be the same as a localized compensation layer and can be regarded as an alternative for manufacturing. In this case, an n-type converter will look like n*/i/n/i*, where n* is the emitter, i is the emitter intrinsic layer, n is the gap material and i* is the collector intrinsic layer. It is understood that in some cases a combination of both localized and delocalized barriers might be preferable.

If more efficient materials are started with, for example, $Hg_{1-x}Cd_xTe$, $Cd_3As_2$, $CdSnAs_2$, SiGe alloys, TAGS, $InAs_{1-x}Sb_x$, $Ga_xIn_{1-x}As_ySb_{1-y}$, etc., efficiencies approaching thermodynamic limit can be achieved. A 40% of ideal Carnot cycle was observed experimentally with $Hg_{0.86}Cd_{0.14}Te$ with In-doped emitter, but even this number can be improved. An actual device for higher temperature operation would require a thin diffusion barrier layer, thinner than the tunnelling length of the carrier in a barrier material, on the emitter interface, to prevent concentration profile wash-out. Known diffusion barriers are typically made of refractory materials like TiN, ZrN, HfN, TaN, W, etc. In the case of HgCdTe, a known diffusion barrier material is Yb (ytterbium oxide).

Example 2

Collector Design

Figure 6:
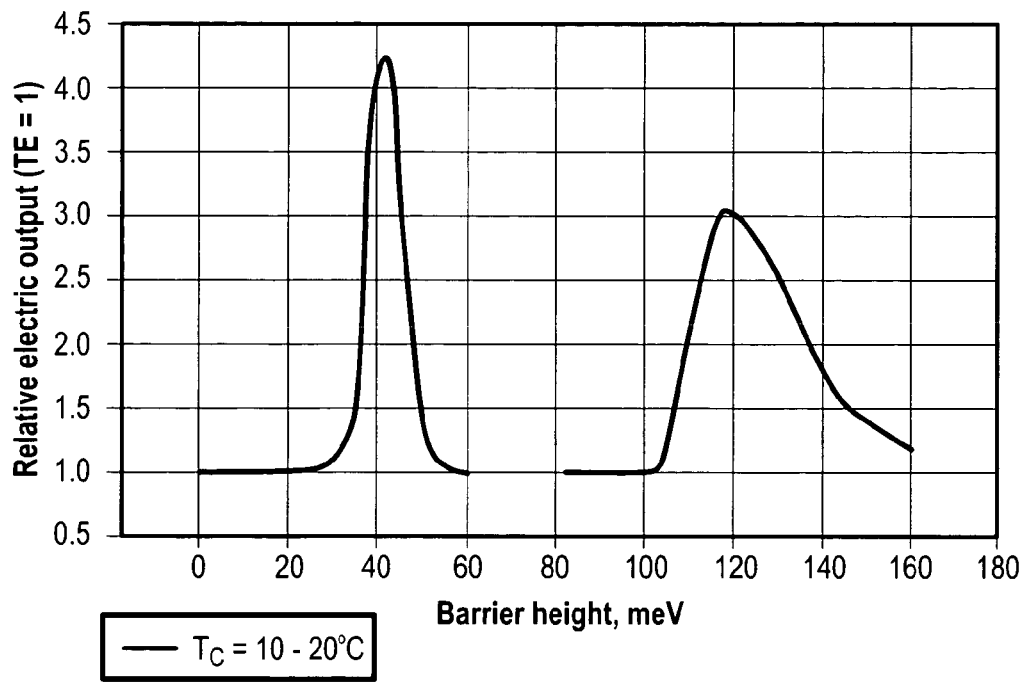
FIG. 6 is a plot of relative electric output normalized to thermoelectric performance as a function of a collector barrier height.

The same implantation method was used to study effects of barrier height on the collector side of a converter. Experimental results are shown in the plot of FIG. 6, in the form of electric output normalized to thermoelectric performance as a function of a collector barrier height. The collector temperature ($T_c$) was close to the room temperature. Two separate effects can be observed. At low barrier height one peak is around localized compensation, where concentration of a p-type impurity equals an n-type impurity concentration. For this case, ionization energy for donors and acceptors is the same. At higher barrier heights the second peak position is exactly the same as in FIG. 4, for corresponding temperatures, suggesting that there is current injection from the gap into the collector contact. Once again, this peak corresponds to a delocalized compensation layer. The emitter and collector are separated by a semiconductor layer, which is many times thicker than both the emitter and collector layer thicknesses. As a result, it is reasonable to assume that emitter and collector sides work to a large extent independently, at least in the limit when open circuit voltage across the converter is smaller than both barrier heights. This provides the opportunity to combine the emitter barrier with another injection barrier, with a blocking layer, or with both.

Figure 7:
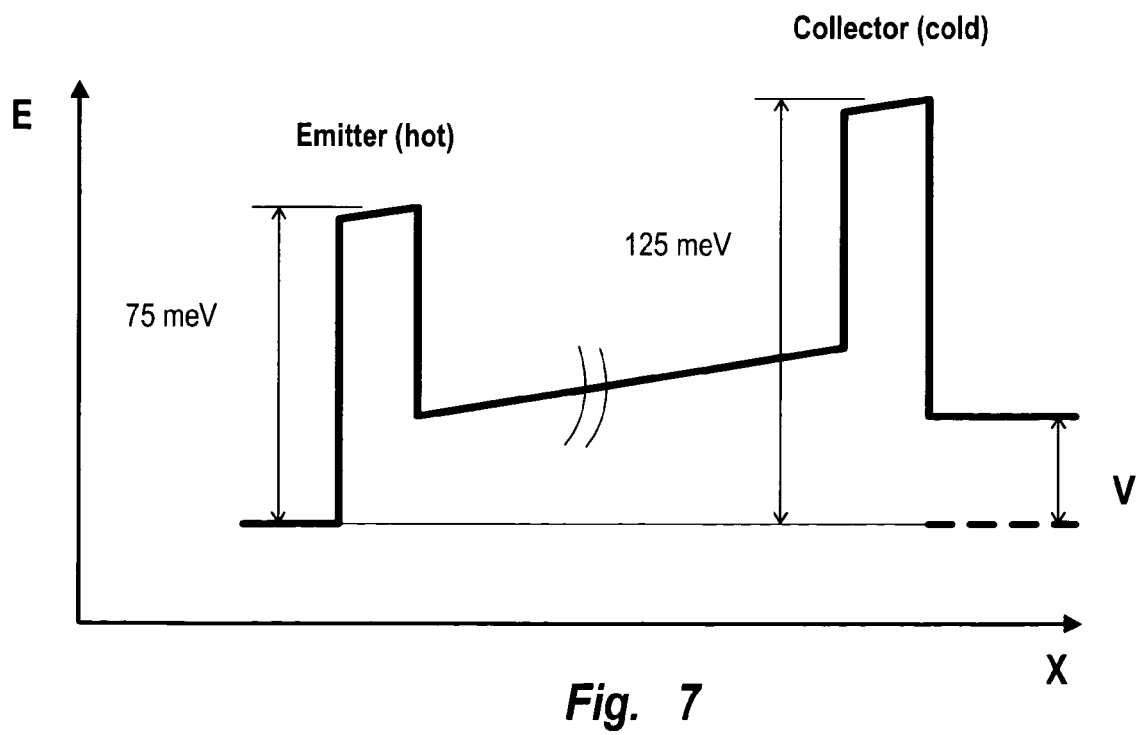
FIG. 7 is a plot of the calculated energy levels for an optimized converter of the invention having an emitter barrier combined with another injection barrier.
Figure 8:
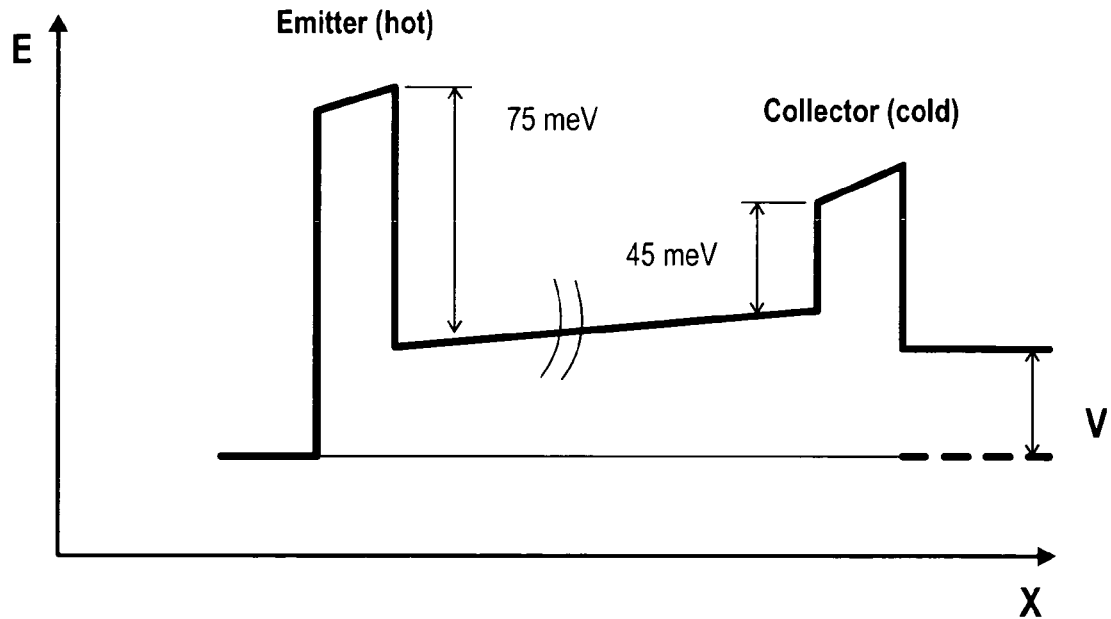
FIG. 8 is a plot of the calculated energy levels for an optimized converter of the invention having an emitter barrier combined with a blocking layer.
Figure 9:
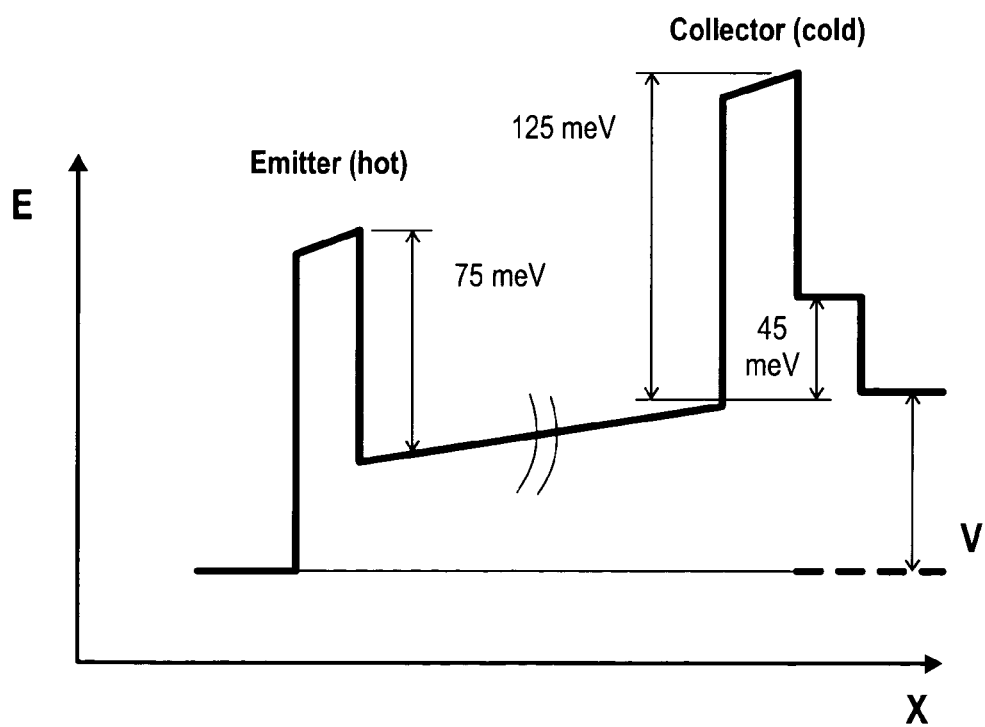
FIG. 9 is a plot of the calculated energy levels for an optimized converter of the invention having an emitter barrier combined with both another injection barrier and a blocking layer.

For example, FIG. 7 is a plot of the calculated energy levels for an optimized converter having an emitter barrier (InSb gap region with $10^{18}$ cm$^{-3}$ Te doping and thickness of 0.5 mm) combined with another injection barrier. The emitter hot side temperature $T_{hot}$=300° C., and the collector cold side temperature $T_{cold}$=10° C. FIG. 8 is a plot of the calculated energy levels for an optimized converter having an emitter barrier (InSb gap region with $10^{18}$ cm$^{-3}$ Te doping and thickness of 0.5 mm) combined with a blocking layer. The emitter hot side temperature $T_{hot}$=300° C., and the collector cold side temperature $T_{cold}$=10° C. FIG. 9 is a plot of the calculated energy levels for an optimized converter having an emitter barrier (InSb gap region with $10^{18}$ cm$^{-3}$ Te doping and thickness of 0.5 mm) combined with both another injection barrier and a blocking layer. The emitter hot side temperature $T_{hot}$=300° C., and the collector cold side temperature $T_{cold}$=10° C.

Barrier heights can be obtained from experimental graphs on FIGS. 4 and 6. The same barrier heights can also be obtained using Kane's diagram (see FIG. 1) with formula (1) for a collector blocking layer and formula (2) for emitter and collector injection layers. Corresponding enhancement of thermoelectric performance (in the limit that open circuit voltage is below the corresponding barrier height) can be as high as about 9 in the case of the collector injection layer, about 8 in the case of a blocking layer, or about 14, when all these layers are present.

For thinner plates, enhancement of thermoelectric performance can be even more dramatic, because thermoelectric open circuit voltage is lower and does not interfere with collector barrier(s). All performance enhancements for 0.5 mm thick plates (gap) comes from two thin layers with combined thickness 300 times less than the gap itself. After a hot carrier crosses the barrier it propagates in a gap and scatters. After roughly 5–10 scatterings the hot carrier is completely thermalized and carrier distribution in the gap is back to the unperturbed Fermi-distribution. For InSb, scattering length is approximately 0.8 microns at room temperature, meaning that after 4–8 microns the gap is not contributing much to the device performance.

If a stack of multiple devices is made and contact resistance does not exceed the gain from additional devices, efficiency can be gained by adding more devices with a thickness more than 5–10 scattering lengths. This approach is described in U.S. Pat. No. 6,396,191 B1 with less detail on a separate device. Ideally, barriers in each device or at least a block of devices should be adjusted to operating temperature in compliance with formula (2). Multiple devices in series can be formed with emitter injection barrier-only, emitter and collector injection barriers, emitter and collector blocking barriers, or all three barriers simultaneously.

Figure 10A:
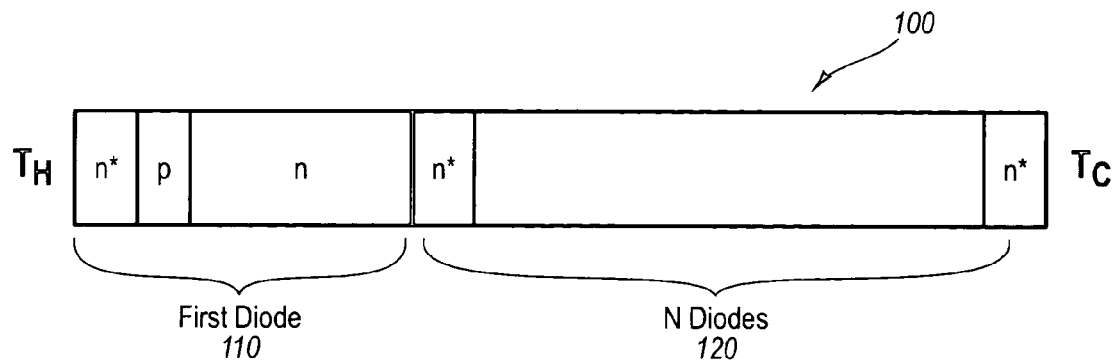
FIG. 10A is a schematic depiction of a thermal diode converter of the invention that includes an emitter injection barrier-only stack.
Figure 10B:
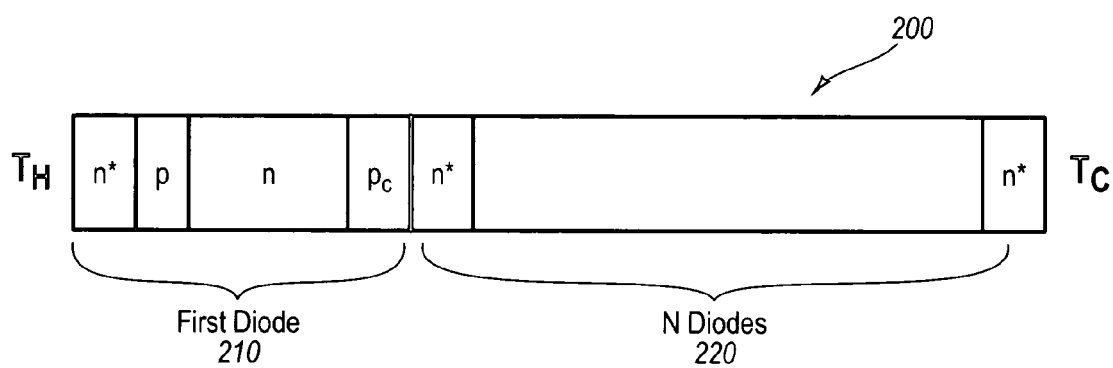
FIG. 10B is a schematic depiction of a further thermal diode converter of the invention that includes an emitter injection barrier plus compensated layer stack.
Figure 10C:
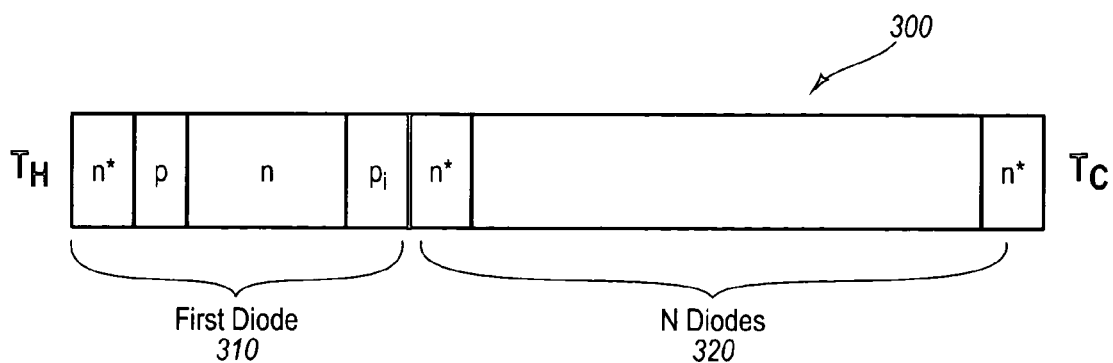
FIG. 10C is a schematic depiction of another thermal diode converter of the invention that includes an emitter injection barrier plus collector injection barrier stack.

For example, FIG. 10A is a schematic depiction of a thermal diode converter of the invention that includes an emitter injection barrier-only stack 100 having a first diode 110 with a design structure of n*/p/n on the hot side ($T_H$), and a plurality of repeating N diodes 120 of the same structure as first diode 110 that terminate on the cold side ($T_C$) with an n* layer. FIG. 10B is a schematic depiction of a thermal diode converter of the invention that includes an emitter barrier plus compensated layer (collector blocking barrier) stack 200. The stack 200 has a first diode 210 with a design structure of n*/p/n/$p_c$ on the hot side ($T_H$), and repeating N diodes 220 of the same structure that end on the cold side ($T_C$) with an n* layer. FIG. 10C is a schematic depiction of another thermal diode converter of the invention that includes an emitter barrier plus collector injection barrier stack 300. The stack 300 has a first diode 310 with a design structure of n*/p/n/$p_i$ on the hot side ($T_H$), and repeating N diodes 320 of the same structure that end on the cold side ($T_C$) with an n* layer.

In addition, a thermal diode converter of the invention can also include an emitter barrier plus compensated layer and collector injection barrier stack. This stack has a first diode with a design structure of n*/p/n/$p_i$/$p_c$ similar to the diode shown in FIG. 1, and repeating N diodes having the same structure as the first diode that terminate with an n* layer as shown in FIGS. 10A–10C.

There are few ways of representing injection barrier. One is that potential barrier stops all carriers with energies below the barrier height. Carriers that go over the barrier constitute a majority of the forward moving carriers and at a scattering length distance from the barrier, effective carrier temperature is higher than the barrier height. For a 100 meV barrier it is roughly 1200 K, with some dilution from a Fermi-distribution in this layer. Assuming linear device behavior in every aspect, the barrier can be regarded as a thermoelectric layer of the same material, but with a Seebeck coefficient four times higher than at room temperature, or a figure of merit sixteen times higher compared with the same layer but without a barrier.

After a few scattering lengths carriers are in a thermal equilibrium again and the barrier injection can be repeated. Unlike a stack of two thermoelectric plates, though, the next device in series will contribute an equivalent Seebeck coefficient, which is more a function of barrier height than interface temperature and can be close to the first device. A stack of two devices now has nearly double the Seebeck coefficient and double the thermal and electric resistance, but because figure of merit goes up like the Seebeck coefficient squared, equivalent figure of merit goes up.

In a 0.5 mm thick device, about 50–60 barrier structures can be accommodated. In reality, contact resistance on each interface will reduce the heat flow through the device and injection current is part of the total heat flow, so the effect magnitude relative to thermoelectric effect will go down. Simple modeling, assuming linear dependence of open circuit voltage on temperature, shows that with ideal contacts contributing only phonon mismatch components to the contact thermal resistance, the optimum number of interfaces is about 20 with a 25 times gain in a figure of merit. After about 100 interfaces there is no gain. A more complicated stack can include temperature adjusted barriers and the like.

The designs shown in FIGS. 10A–10C are very useful for refrigeration applications, because equivalent Peltier coefficient is proportional to the sum of separate barrier heights. Coefficient of performance is proportional to the square of the Peltier coefficient and even a few barriers will result in a much better refrigeration performance.

As already mentioned above, after about 5–10 scattering lengths, gap does not contribute much to the device performance. This means that most of the semiconductor material thickness can be replaced with a metal. A metal layer in this case is used to reduce specific heat flow. The device can be built by depositing emitter and collector semiconductor structures as described above on a metal plate. The metal should be matched to the semiconductor in terms of thermal expansion coefficients. In some cases a thin intermediate amorphous layer of a semiconductor may be necessary between the metal and emitter and collector structures. For a p-type converter, a metal gap is more problematic, because reliable ohmic contacts are required.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A solid state energy converter with n-type conductivity, comprising:
    an emitter region in thermal communication with a hot heat exchange surface, the emitter region comprising an n-type region with donor concentration n* for electron emission; a p-type barrier layer with acceptor concentration p* in contact with the emitter region; and
    and a segmented gap region in contact with the p-type barrier layer and comprising a first layer of an n-type semiconductor material, and a second layer of a different highly n-doped semiconductor material, the second layer reducing heat flow density, wherein the p-type barrier layer provides a potential barrier and a Fermi level discontinuity between the emitter region and the segmented nap region.

2. The solid state energy converter of claim 1, further comprising a collector region in thermal communication with a cold heat exchange surface, the collector region being in electrical and thermal communication with the gap region.

3. The solid state energy converter of claim 2, wherein the gap region is adjacent to the collector region.

4. The solid state energy converter of claim 2, further comprising a first ohmic contact in electrical communication with the emitter region.

5. The solid state energy converter of claim 4, further comprising a second ohmic contact in electrical communication with the collector region.

6. The solid state energy converter of claim 5, wherein the first and second ohmic contacts close an electrical circuit through an external load for heat to electricity conversion.

7. The solid state energy converter of claim 5, wherein the first and second ohmic contacts close an electrical circuit through an external power source for electricity to refrigeration conversion.

8. The solid state energy converter of claim 1, wherein the emitter region comprises a metal or a highly doped semiconductor.

9. The solid state energy converter of claim 1, wherein the p* doping concentration of the p-type barrier layer relates to the n doping concentration of the gap region as $p_i > n_i(m^*_p/m^*_n)$, where $m^*_p$ is the effective mass of holes, $m^*_n$ is the effective mass of electrons, and subscript i denotes ionized fraction of carriers at a given temperature.

10. The solid state energy converter of claim 2, wherein the collector region comprises an additional injection barrier layer with a carrier concentration p** that is adjacent to the gap region to reduce a thermoelectric back flow component.

11. The solid state energy converter of claim 2, wherein the collector region comprises an additional compensation layer with acceptor concentration p* serving as a blocking layer at the cold side of the converter, and the acceptor concentration p* being the same as the donor concentration in the gap region.

12. The solid state energy converter of claim 2, wherein the collector region comprises two p-type layers, one layer with a carrier concentration p* serving as a blocking layer at the cold side of the converter, and the other layer with a carrier concentration p** serving as an additional injection barrier layer and being adjacent to the gap region to reduce a thermoelectric back flow component.

13. The solid state energy converter of claim 10, wherein the p** doping concentration of the additional injection barrier layer relates to the n doping concentration of the gap region as $p_i > n_i(m^*_p/m^*_n)$, where $m^*_p$ is the effective mass of holes, $m^*_n$ is the effective mass of electrons, and subscript i denotes ionized fraction of carriers at a given temperature.

14. The solid state energy converter of claim 1, further comprising a first ohmic contact in electrical communication with the emitter region.

15. The solid state energy converter of claim 1, further comprising a second ohmic contact in electrical communication with the gap region.

16. The solid state energy converter of claim 1, wherein the first layer is at least 1 electron scattering length wide.

17. The solid state energy converter of claim 1, wherein the first layer is at least 5 electron scattering lengths wide.

18. A solid state energy converter with p-type conductivity, comprising:
    an emitter region in thermal communication with a hot heat exchange surface, the emitter region comprising a p-type region with acceptor concentration p* for hole emission;
    a semiconductor gap region with a donor doping p, the gap region in electrical and thermal communication with the emitter region; wherein the gap region is segmented and comprises a first layer of a p-type semiconductor material and a second layer of a different highly doped p-type semiconductor material; and
    an n-type barrier layer with donor concentration n* in contact with the emitter region and with the gap region, the n-type barrier layer providing a potential barrier and Fermi-level discontinuity between the emitter region and the gap region.

19. The solid state energy converter of claim 18, further comprising a collector region in thermal communication with a cold heat exchange surface, the collector region being in electrical and thermal communication with the gap region.

20. The solid state energy converter of claim 19, wherein the gap region is adjacent to the collector region.

21. The solid state energy converter of claim 19, further comprising a first ohmic contact in electrical communication with the emitter region.

22. The solid state energy converter of claim 21, further comprising a second ohmic contact in electrical communication with the collector region.

23. The solid state energy converter of claim 22, wherein the first and second ohmic contacts close an electrical circuit through an external load for heat to electricity conversion.

24. The solid state energy converter of claim 22, wherein the first and second ohmic contacts close an electrical circuit through an external power source for electricity to refrigeration conversion.

25. The solid state energy converter of claim 18, wherein the gap region is at least 1 carrier scattering length wide.

26. The solid state energy converter of claim 18, wherein the gap region is at least 5 carrier scattering lengths wide.

27. A solid state energy converter, comprising:
a thermal diode stack comprising:
- a first diode with a design structure of n*/p/n on a hot side of the converter, the n* representing a n-type emitter region with a donor concentration n*, the p representing a p-type barrier region with an acceptor concentration p, and n representing a n-type segmented gap region with a donor concentration n and comprising a first layer of an n-type semiconductor material and a second layer of a different highly doped n-type semiconductor material, wherein the barrier layer is configured to provide a potential barrier and Fermi-level discontinuity between the emitter region and the gap region;
- a plurality of diodes having the same structure as the first diode and connected with the first diode; and
- an n* layer that terminates the plurality of diodes on a cold side of the converter.

28. A solid state energy converter, comprising:
a thermal diode stack comprising:
- a first diode with a design structure of n*/p/n/p$_c$, on a hot side of the converter, the n* representing an n-type emitter region with a donor concentration n*, the p representing a p-type barrier region with an acceptor concentration p, the n representing a segmented n-type gap region with a donor concentration n and comprising a first layer of an n-type semiconductor material and a second layer of a different highly doped n-type semiconductor material, and the p$_c$ representing a p-type compensation layer acting as a collector blocking barrier with acceptor concentration p*, wherein the barrier layer is configured to provide a potential barrier and Fermi-level discontinuity between the emitter region and the gap region; and
- a plurality of diodes having the same structure as the first diode that terminate on a cold side of the converter with an n* layer.

29. A solid state energy converter, comprising: a thermal diode stack comprising:
- a first diode with a design structure of n*/p/n/p$_i$ on a hot side of the converter, the n* representing an n-type emitter region with a donor concentration n*, the p representing a p-type barrier region with an acceptor concentration p, the n representing a segmented n-type gap region with a donor concentration n and comprising a first layer of an n-type semiconductor material and a second layer of a different highly doped n-type semiconductor material, and the p$_i$ representing an additional p-type barrier region with an acceptor concentration p**, wherein the barrier layer is configured to provide a potential barrier and Fermi-level discontinuity between the emitter region and the gap region; and
- a plurality of diodes having the same structure as the first diode that terminate on a cold side of the converter with an n* layer.

30. A solid state energy converter, comprising:
a thermal diode stack comprising: a first diode with a design structure of n*/p/n/p$_i$/p$_c$ on a hot side of the converter, the n* representing a n-type emitter region with a donor concentration n*, the p representing a p-type barrier region with an acceptor concentration p, the n representing a n-type gap region with a donor concentration n, the p$_i$ representing an additional p-type barrier region with a donor concentration p**, and the p$_c$, representing a p-type compensation layer acting as a collector blocking barrier with a donor concentration of p*, wherein the barrier layer is configured to provide a potential barrier and Fermi-level discontinuity between the emitter region and the gap region; and
a plurality of diodes having the same structure as the first diode that terminate on a cold side of the converter with an n* layer.

31. A method for converting thermal energy to electric energy, or electric energy to refrigeration, comprising:
injecting carriers into an n-type gap region from a highly doped n* emitter region through a p-type barrier layer positioned between the emitter region and the gap region, wherein:
- the barrier layer is configured to provide a potential barrier and Fermi-level discontinuity between the emitter region and the gap region; and
- the gap region is segmented and comprises a first layer of an n-type semiconductor material and a second layer of a different highly doped n-type semiconductor material;
allowing for discontinuity of corresponding Fermi-levels; and
forming a potential barrier to sort electrons by energy.

32. A method for converting thermal energy to electric energy, or electric energy to refrigeration, comprising:
injecting carriers into a p-type gap region from a highly doped p* emitter region through an n-type barrier layer positioned between the emitter region and the gap region, wherein:
- the barrier layer is configured to provide a potential barrier and Fermi-level discontinuity between the emitter region and the gap region; and
- the gap region is segmented and comprises a first layer of an n-type semiconductor material and a second layer of a different highly doped n-type semiconductor material;
allowing for discontinuity of corresponding Fermi-levels; and
forming a potential barrier to sort electrons by energy.

33. A solid state energy converter, comprising:
a thermal diode stack comprising: a first diode with a design structure of p*/n/p/n$_i$/n$_c$ on a hot side of the converter, the p* representing p-type emitter region with an acceptor concentration p*, the n representing an n-type barrier region with a donor concentration n, the p representing a p-type gap region with an acceptor concentration p, the n$_i$ representing an additional n-type barrier region with a donor concentration n**, and the n$_c$, representing an n-type compensation layer acting as a collector blocking barrier with a donor concentration of n*, wherein the barrier layer is configured to provide a potential barrier and Fermi-level discontinuity between the emitter region and the gap region; and
a plurality of diodes having the same structure as the first diode that terminate on a cold side of the converter with a p* layer.

* * * * *

UNITED STATES PATENT AND TRADEMARK OFFICE
CERTIFICATE OF CORRECTION

PATENT NO. : 7,109,408 B2  Page 1 of 1
APPLICATION NO. : 10/801072
DATED : September 19, 2006
INVENTOR(S) : Kucherov et al.

It is certified that error appears in the above-identified patent and that said Letters Patent is hereby corrected as shown below:

Column 6
Line 51, change "Doping" to --The doping--

Column 8
Line 57, after "height", insert --,--
Line 61, after "height", insert --,--

Column 11
Line 23, before "a segmented", remove [and]

Column 13
Line 4, before "n-type", change "a" to --an--
Line 61, before "n-type", change "a" to --an--

Signed and Sealed this

First Day of June, 2010

David J. Kappos
*Director of the United States Patent and Trademark Office*